United States Patent
Kitajima

(10) Patent No.: US 9,589,948 B2
(45) Date of Patent: Mar. 7, 2017

(54) SEMICONDUCTOR DEVICE

(71) Applicant: SEIKO INSTRUMENTS INC., Chiba-shi, Chiba (JP)

(72) Inventor: Yuichiro Kitajima, Chiba-shi (JP)

(73) Assignee: SII SEMICONDUCTOR CORPORATION (JP)

( * ) Notice: Subject to any disclaimer, the term of this patent is extended or adjusted under 35 U.S.C. 154(b) by 19 days.

(21) Appl. No.: 14/430,494

(22) PCT Filed: Aug. 27, 2013

(86) PCT No.: PCT/JP2013/072835
§ 371 (c)(1),
(2) Date: Mar. 23, 2015

(87) PCT Pub. No.: WO2014/050407
PCT Pub. Date: Apr. 3, 2014

(65) Prior Publication Data
US 2015/0287712 A1    Oct. 8, 2015

(30) Foreign Application Priority Data

Sep. 25, 2012 (JP) .................. 2012-211306
Aug. 7, 2013 (JP) .................. 2013-164397

(51) Int. Cl.
*H02H 3/00* (2006.01)
*H01L 27/02* (2006.01)
(Continued)

(52) U.S. Cl.
CPC ........ *H01L 27/0248* (2013.01); *H01L 27/088* (2013.01); *H02H 11/00* (2013.01);
(Continued)

(58) Field of Classification Search
USPC ........................................... 361/56
See application file for complete search history.

(56) References Cited

U.S. PATENT DOCUMENTS 5,151,767 A     9/1992   Wong .................. 357/43
5,196,980 A *   3/1993   Carson ............... G01R 1/36
                                                361/18
(Continued)

FOREIGN PATENT DOCUMENTS

EP          0512605       11/1992
JP         2002095159      3/2002

OTHER PUBLICATIONS

International Search Report mailed Sep. 24, 2013 issued in International Appln. No. PCT/JP2013/072835.
(Continued)

*Primary Examiner* — Ronald W Leja
(74) *Attorney, Agent, or Firm* — Adams & Wilks

(57) ABSTRACT

A semiconductor device has first and second NMOS transistors and an internal circuit, all formed in the same semiconductor substrate. The first NMOS transistor has a gate connected to a power supply terminal configured for connection to a power supply, a source and a back gate connected to an internal ground node, and a drain connected to a ground terminal configured for connection to the power supply. The second NMOS transistor has a gate connected to the ground terminal, a source and a back gate connected to the internal ground node, and a drain connected to the power supply terminal. The internal circuit is configured to operate with a voltage between the power supply terminal and the internal ground node. During a normal connection state in which the power supply is normally connected to the semiconductor device, current flows through the internal circuit and the second NMOS transistor.

10 Claims, 5 Drawing Sheets

(51) Int. Cl.
*H02H 11/00* (2006.01)
*H02J 7/00* (2006.01)
*H02J 1/00* (2006.01)
*H03K 17/08* (2006.01)
*H01L 27/088* (2006.01)

(52) U.S. Cl.
CPC ............ *H02H 11/002* (2013.01); *H02J 1/00* (2013.01); *H02J 7/00* (2013.01); *H02J 7/0034* (2013.01); *H03K 17/08* (2013.01); *H01L 2224/32245* (2013.01); *H01L 2224/48247* (2013.01); *H01L 2224/73265* (2013.01)

(56) References Cited

U.S. PATENT DOCUMENTS

| | | | | |
|---|---|---|---|---|
| 5,594,381 A * | 1/1997 | Bingham | ......... | G01R 19/16538 327/29 |
| 5,689,209 A * | 11/1997 | Williams | ............. | H02J 7/0031 327/425 |
| 5,742,463 A * | 4/1998 | Harris | ................... | H02H 9/025 361/111 |
| 6,031,702 A * | 2/2000 | Williams | ............. | H02H 7/1213 361/101 |
| 6,078,512 A * | 6/2000 | Bouvier | ................ | H02M 7/219 363/127 |
| 6,744,883 B1 * | 6/2004 | Bingel | .................... | H04M 1/74 379/106.09 |
| 7,324,315 B2 * | 1/2008 | Harris | .................. | H03K 17/302 361/58 |
| 7,576,962 B2 * | 8/2009 | Harris | .................... | H02H 3/025 361/111 |
| 2005/0139931 A1 * | 6/2005 | Arai | .................... | H01L 27/0928 257/370 |
| 2007/0164614 A1 * | 7/2007 | Dias | ......................... | H02J 1/00 307/80 |
| 2007/0205431 A1 * | 9/2007 | Robb | .............. | H01L 21/823487 257/119 |
| 2010/0118459 A1 * | 5/2010 | Logiudice | ........... | H02H 11/003 361/84 |
| 2014/0076613 A1 * | 3/2014 | Mahler | ............. | H01L 23/49586 174/251 |
| 2015/0287712 A1 * | 10/2015 | Kitajima | ............... | H02H 11/002 361/56 |

OTHER PUBLICATIONS

European Search Report mailed May 17, 2016, issued in Application No. EP 13 84 1055.

* cited by examiner 36   33 32 31   35   34

SEMICONDUCTOR DEVICE

BACKGROUND OF THE INVENTION

Technical Field

The present invention relates to a semiconductor device. In particular, the present invention relates to a semiconductor device configured to prevent a current from flowing when a DC power supply is reversely connected.

Background Art

A description is now given of a related-art electronic device having a function of protecting an internal circuit against so-called reverse connection in which a DC power supply such as a battery is reversely connected. FIG. 5 is a circuit diagram illustrating an electronic device disclosed in Patent Literature 1. Operations of a circuit having a protection function are described for cases where a power supply is normally and reversely connected to the electronic device.

<Normal Connection State in which Power Supply is Normally Connected to Electronic Device>

In a normal connection state in which a power supply 1 is normally connected to an electronic device 3, a voltage between a power supply terminal TV and a ground line LG is divided by resistors R1 and R2. The divided voltage is applied to a gate of an NMOS transistor MT1. When the power supply 1 is normally connected, the NMOS transistor MT1 is turned on, and accordingly current flows through a channel of the NMOS transistor MT1 to electrically connect a ground terminal TG and the ground line LG to each other, to thereby establish the supply of power to the electronic device 3.

<Reverse Connection State in which Power Supply is Reversely Connected to Electronic Device>

In a reverse connection state in which the power supply 1 is reversely connected to the electronic device 3, the voltage applied to the gate of the NMOS transistor MT1 is lower than a voltage applied to a source thereof, and accordingly the NMOS transistor MT1 is turned off, and a parasitic diode is biased in the reverse direction, with the result that the ground terminal TG and the ground line LG are not electrically connected to each other. Thus, a reverse current does not flow, and hence the electronic device 3 is protected against the reverse connection.

CITATION LIST

Patent Literature

[PTL 1] JP 2002-095159 A

In the case where the above-mentioned related art is applied to a semiconductor device, in the reverse connection state, the NMOS transistor MT1 is turned off, and accordingly the ground line LG for an internal circuit has a voltage substantially equal to a lower power supply voltage. In this case, however, the ground line LG is connected with high impedance, and accordingly the voltage may be applied to the internal circuit via a current path formed by a parasitic element present in the internal circuit, resulting in a risk in that the internal circuit may perform an unintended operation.

The present invention has been made in view of the above-mentioned risk, and has an object to provide a semiconductor device having a function capable of effectively interrupting a current path in a reverse connection state in which a DC power supply is reversely connected to the semiconductor device.

SUMMARY OF THE INVENTION

In order to solve the above-mentioned problem, according to one embodiment of the present invention, there is provided a semiconductor device, including: a first MOS transistor of a first conductivity type, including a gate connected to a first power supply terminal, a source and a back gate that are connected to an internal second power supply node, and a drain connected to a second power supply terminal; a second MOS transistor of the first conductivity type, including a gate connected to the second power supply terminal, a source and a back gate that are connected to the internal second power supply node, and a drain connected to the first power supply terminal; and an internal circuit configured to use a voltage between the first power supply terminal and the internal second power supply node as an operating power supply.

According to the one embodiment of the present invention, in the reverse connection state, an internal node of the internal circuit or a diffusion region of a guard ring is prevented from becoming a floated state. Consequently, a current path formed by a parasitic element present in the internal circuit may be effectively interrupted so that the internal circuit may stably stop its operation.

DETAILED DESCRIPTION OF THE EMBODIMENT

Now, an embodiment of the present invention is described with reference to the drawings.

Figure 1:
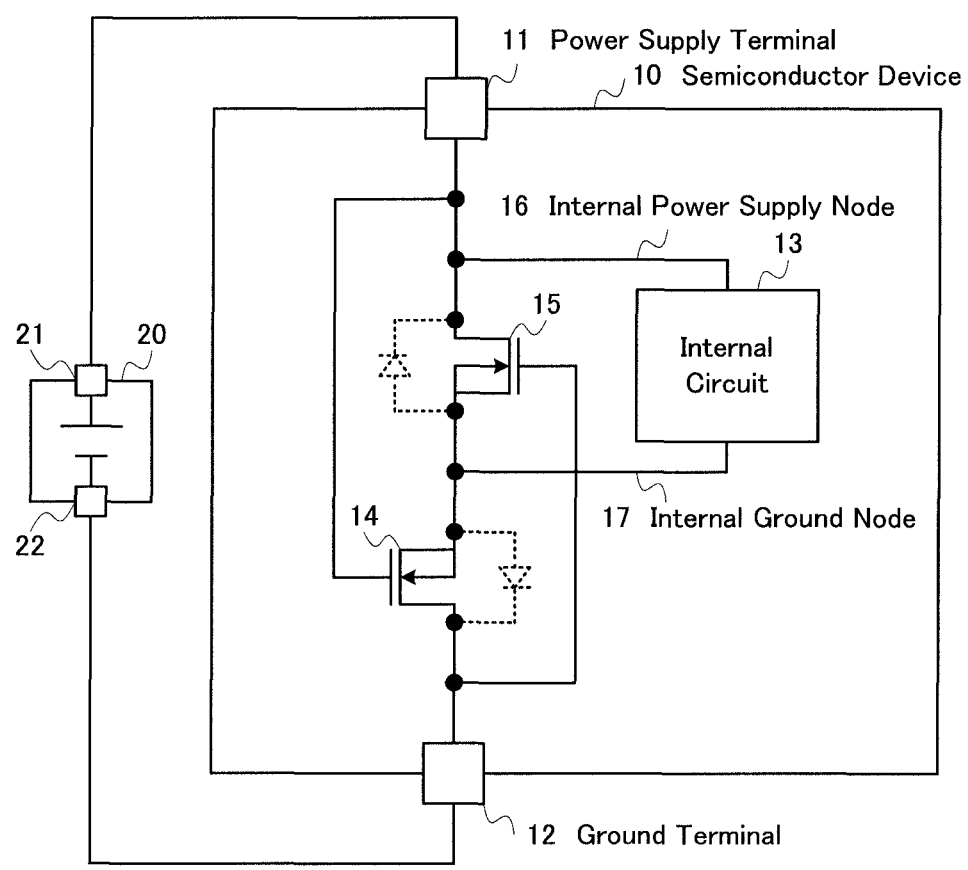
FIG. 1 is a circuit diagram illustrating a semiconductor device.

As illustrated in FIG. 1, a semiconductor device 10 includes a power supply terminal (first power supply terminal) 11, a ground terminal (second power supply terminal) 12, an internal circuit 13, NMOS transistors 14 and 15, an internal power supply node (internal first power supply node) 16, and an internal ground node (internal second power supply node) 17. Further, a power supply terminal 21 of a power supply 20 is connected to the power supply terminal 11 of the semiconductor device 10, and a ground terminal 22 of the power supply 20 is connected to the ground terminal 12 of the semiconductor device 10.

The NMOS transistor 14 has a gate connected to the power supply terminal 11, a source and a back gate for applying a substrate potential that are connected to the internal ground node 17, and a drain connected to the ground terminal 12. The NMOS transistor 15 has a gate connected to the ground terminal 12, a source and a back gate for applying a substrate potential that are connected to the internal ground node 17, and a drain connected to the power supply terminal 11. Accordingly, a parasitic diode is formed between the source and the drain of each of the NMOS transistors 14 and 15.

The internal circuit 13 has a power supply terminal connected to the power supply terminal 11, and the internal circuit 13 has a ground terminal connected to the internal ground node 17. In other words, the internal circuit 13 uses a voltage between the power supply terminal 11 and the internal ground node 17 as an operating power supply. In this case, the power supply terminal 11 is connected to the internal power supply node 16, and the ground terminal 12 is connected to the internal ground node 17 via the NMOS transistor 14. Operations of a circuit having a protection function are now described for respective cases where the power supply is normally and reversely connected to the electronic device.

<Normal Connection State in which Power Supply is Normally Connected to Semiconductor Device>

Continuing to refer to FIG. 1, in a normal connection state in which the power supply 20 is normally connected to the semiconductor device 10, because the internal power supply node 16 is connected to the power supply terminal 11, a voltage of the internal power supply node 16 is a power supply voltage supplied from the power supply 20. Further, a gate voltage of the NMOS transistor 14 is the power supply voltage supplied from the power supply 20, and accordingly the NMOS transistor 14 is turned on. Then, a voltage of the internal ground node 17 is substantially equal to a voltage of the ground terminal 12, and is a ground voltage supplied from the power supply 20. Accordingly, the supply of power to the internal circuit 13 is established. The internal circuit 13 performs a desired operation based on the power supply voltage and the ground voltage. Note that, drive capability of the NMOS transistor 14 is appropriately circuit-designed in accordance with current consumption of the internal circuit 13.

Further, a gate voltage of the NMOS transistor 15 is the ground voltage supplied from the power supply 20, and accordingly the NMOS transistor 15 is turned off.

In this case, a gate insulating film of the NMOS transistor 14 needs to have a film thickness having a breakdown voltage that is sufficiently higher than the power supply voltage supplied from the power supply 20.

<Reverse Connection State in which Power Supply is Reversely Connected to Semiconductor Device>

Figure 2:
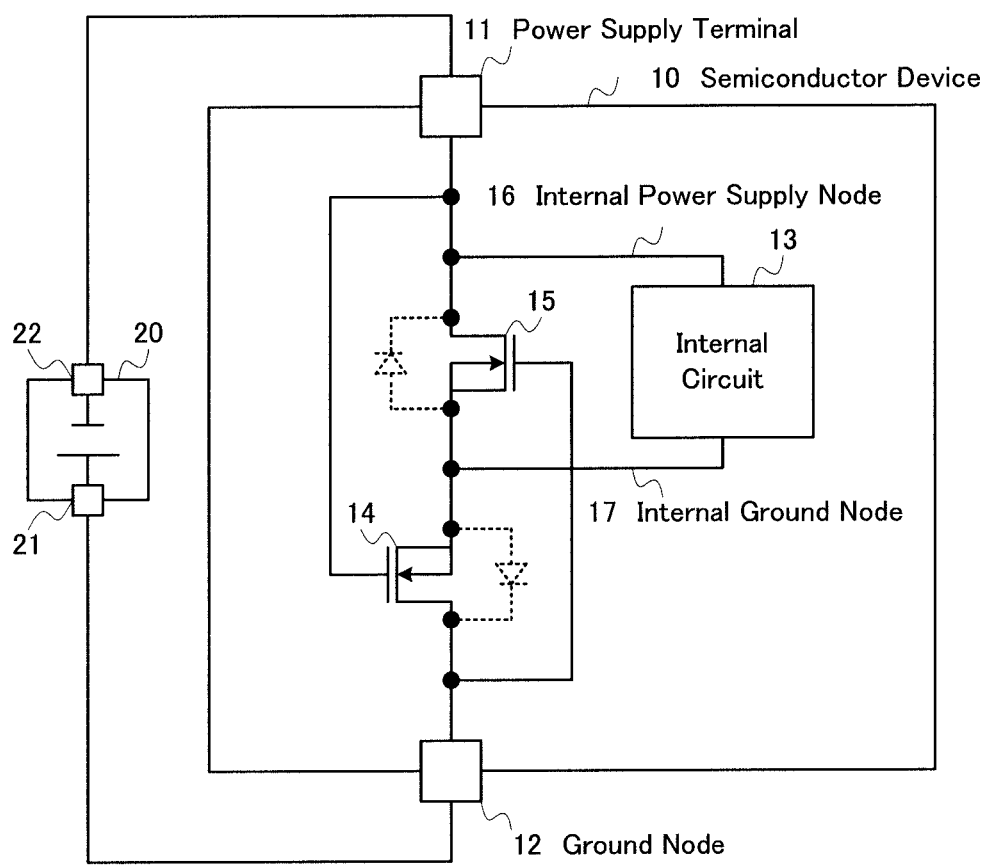
FIG. 2 is a circuit diagram illustrating the semiconductor device.

In a reverse connection state in which the power supply 20 is reversely connected to the semiconductor device 10, as illustrated in FIG. 2, the power supply terminal 21 of the power supply 20 is connected to the ground terminal 12 of the semiconductor device 10, and the ground terminal 22 of the power supply 20 is connected to the power supply terminal 11 of the semiconductor device 10.

In this case, the gate voltage of the NMOS transistor 14 is the ground voltage supplied from the power supply 20, and accordingly the NMOS transistor 14 is turned off. Further, the parasitic diode of the NMOS transistor 14 is reversely biased between the ground terminal 12 and the internal ground node 17, and accordingly no current flows. Thus, the ground terminal 12 and the internal ground node 17 are not electrically connected to each other. Consequently, in the reverse connection state, no current path is formed from the ground terminal 12 to the internal circuit 13, and hence the internal circuit 13 is protected.

Further, the gate voltage of the NMOS transistor 15 is the power supply voltage supplied from the power supply 20, and accordingly the NMOS transistor 15 is turned on. Thus, the voltage of the internal ground node 17 is substantially equal to the voltages of the power supply terminal 11 and the internal power supply node 16 via the NMOS transistor 15 having low impedance, and is the ground voltage supplied from the power supply 20. In other words, the voltages of the power supply terminal and the ground terminal of the internal circuit 13 are both the ground voltage supplied from the power supply 20. Accordingly, in the reverse connection state, the internal node of the internal circuit 13 or a diffusion region of a guard ring is prevented from becoming a floated state. Consequently, a current path formed by the parasitic element present in the internal circuit 13 can be effectively interrupted so that the internal circuit 13 can stably stop its operation.

In this case, a gate insulating film of the NMOS transistor 15 have a film thickness having a breakdown voltage that is sufficiently higher than the power supply voltage supplied from the power supply 20.

The NMOS transistors 14 and 15 protect the internal circuit against the reverse connection of the power supply, and both also function as ESD protection elements for the internal circuit 13. Now, a protection operation against ESD, which occurs when a voltage surge is applied to the power supply terminal, is described.

<Case where a Positive Voltage Surge with Respect to Ground Terminal 12 is Applied to Power Supply Terminal 11>

When a positive voltage surge is applied to the power supply terminal 11, a current surge flows from the power supply terminal 11 to the ground terminal 12. In this case, the parasitic diode of the NMOS transistor 15 causes the current surge to flow in the reverse direction due to the breakdown operation, and the parasitic diode of the NMOS transistor 14 causes the current surge to flow in the forward direction, with the result that no current surge flows through the internal circuit 13. Consequently, the internal circuit 13 is protected from the current surge.

In this case, the voltage surge is applied to the gate of the NMOS transistor 14 connected to the power supply terminal 11. Accordingly, the NMOS transistor 15 is set as follows for the purpose of protecting the gate of the NMOS transistor 14. The size, impurity concentration, and the like of the NMOS transistor 15 are set so that a start voltage for the breakdown operation of the parasitic diode of the NMOS transistor 15 may be equal to or lower than a breakdown voltage of the gate insulating film of the NMOS transistor 14, and that the parasitic diode of the NMOS transistor 15 may cause a current surge to flow before the gate insulating film of the NMOS transistor 14 is broken down. Further, the start voltage for the breakdown operation of the parasitic diode of the NMOS transistor 15 also needs to be equal to or higher than the voltage that is supplied from the power supply 20 in the normal connection state illustrated in FIG. 1.

<Case where a Negative Voltage Surge with Respect to Ground Terminal 12 is Applied to Power Supply Terminal 11>

When a negative voltage surge is applied to the power supply terminal 11, a current surge flows from the ground terminal 12 to the power supply terminal 11. In this case, the parasitic diode of the NMOS transistor 14 causes the current surge to flow in the reverse direction due to the breakdown operation, and the parasitic diode of the NMOS transistor 15 causes the current surge to flow in the forward direction, with the result that no current surge flows through the internal circuit 13. Consequently, the internal circuit 13 is protected from the current surge.

In this case, the voltage surge is applied to the gate of the NMOS transistor 15. Accordingly, the NMOS transistor 14 is set as follows for the purpose of protecting the gate of the NMOS transistor 15. The size, impurity concentration, and the like of the NMOS transistor 14 are set so that a start operation for the breakdown operation of the parasitic diode of the NMOS transistor 14 may be equal to or lower than a breakdown voltage of the gate insulating film of the NMOS transistor 15, and that the parasitic diode of the NMOS transistor 14 may cause a current surge to flow before the gate insulating film of the NMOS transistor 15 is broken down. Further, a start voltage for the breakdown operation of the parasitic diode of the NMOS transistor 14 also needs to be equal to or higher than the voltage that is supplied from the power supply 20 in the reverse connection state illustrated in FIG. 2.

Figure 3:
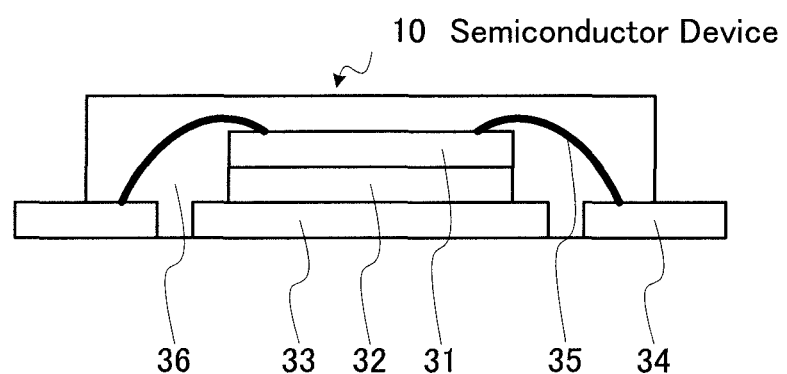
FIG. 3 are cross-sectional views illustrating the semiconductor device.
Figure 3:
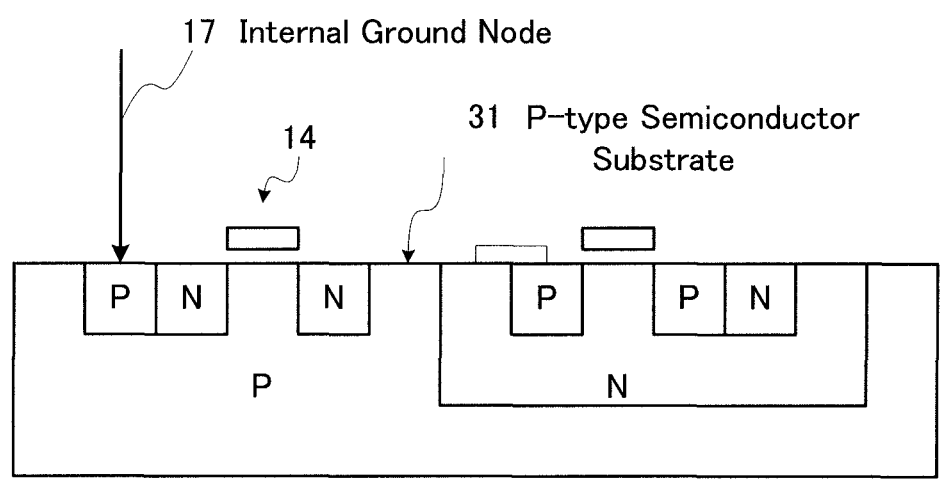

A case is considered in which a semiconductor device having the above-mentioned circuit configuration is encapsulated by a resin package as an IC. In this case, as illustrated in FIG. 3(A), the semiconductor device 10 includes a P-type semiconductor substrate 31 having a circuit formed in a front surface thereof, an insulating adhesive material 32 made of an insulating paste or an insulating film, a die pad 33, a lead 34, a wire 35, and an encapsulating resin 36.

In the P-type semiconductor substrate 31, the above-mentioned circuit is formed by a known semiconductor technology, such as photolithography. The insulating adhesive material 32 bonds the P-type semiconductor substrate 31 and the die pad 33 to each other in a state in which the P-type semiconductor substrate 31 and the die pad 33 are electrically insulated from each other. The die pad 33 has a rear surface exposed from the semiconductor device 10 to the outside, to thereby dissipate heat generated by the P-type semiconductor substrate 31 to the outside of the semiconductor device 10. Further, the die pad 33 supports the P-type semiconductor substrate 31. The wire 35 electrically connects an external connection terminal (for example, the power supply terminal 11) of the above-mentioned circuit formed in the P-type semiconductor substrate 31 and the lead 34 to each other. The lead 34 is used for electrical connection between the semiconductor device 10 and a mounting substrate having a circuit formed thereon. The encapsulating resin 36 encapsulates the P-type semiconductor substrate 31, the insulating adhesive material 32, the die pad 33, the lead 34, and the wire 35.

In the case of the circuit configuration of the semiconductor device 10 illustrated in FIG. 1, a voltage of the back gate of the NMOS transistor 14 is equal to the voltage of the internal ground node 17. Accordingly, as illustrated in FIG. 3(B), the P-type semiconductor substrate 31 has the voltage of the internal ground node 17. In this case, because the insulating adhesive material 32 is used, the P-type semiconductor substrate 31 and the die pad 33 are not electrically connected to each other. Thus, even when there is an electrical influence on the die pad 33 from the outside, the voltage of the P-type semiconductor substrate 31 is not affected but maintained at the voltage of the internal ground node 17.

Figure 4:
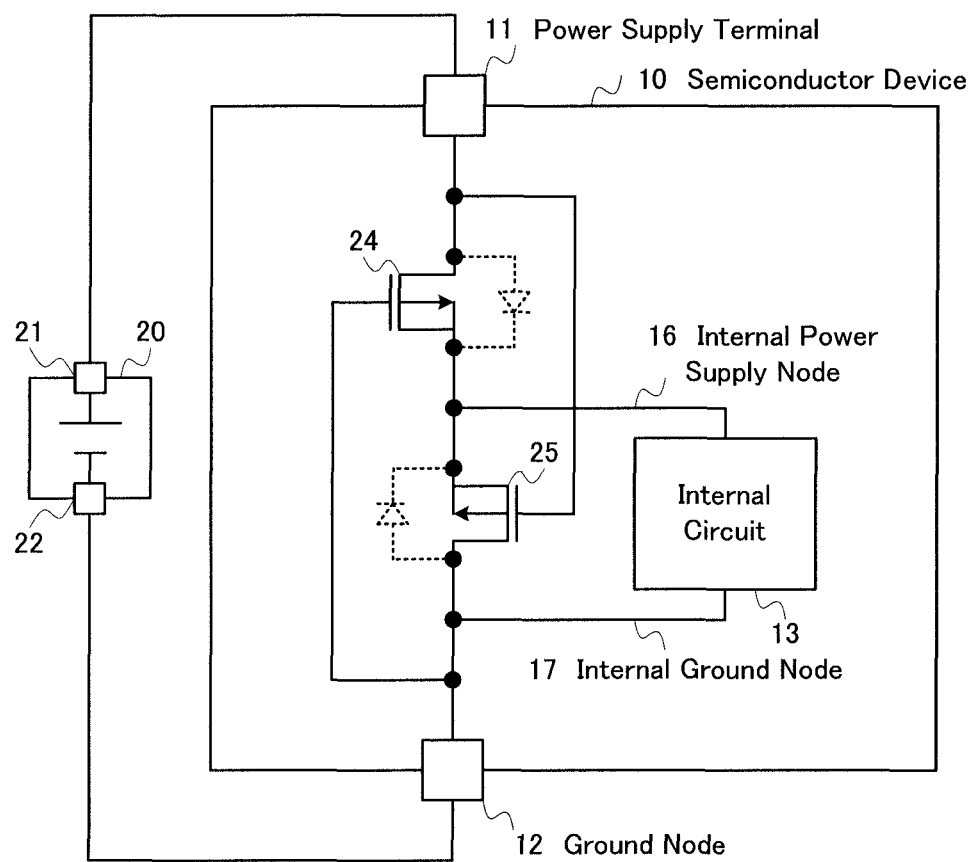
FIG. 4 is a circuit diagram illustrating a semiconductor device.
Figure 5:
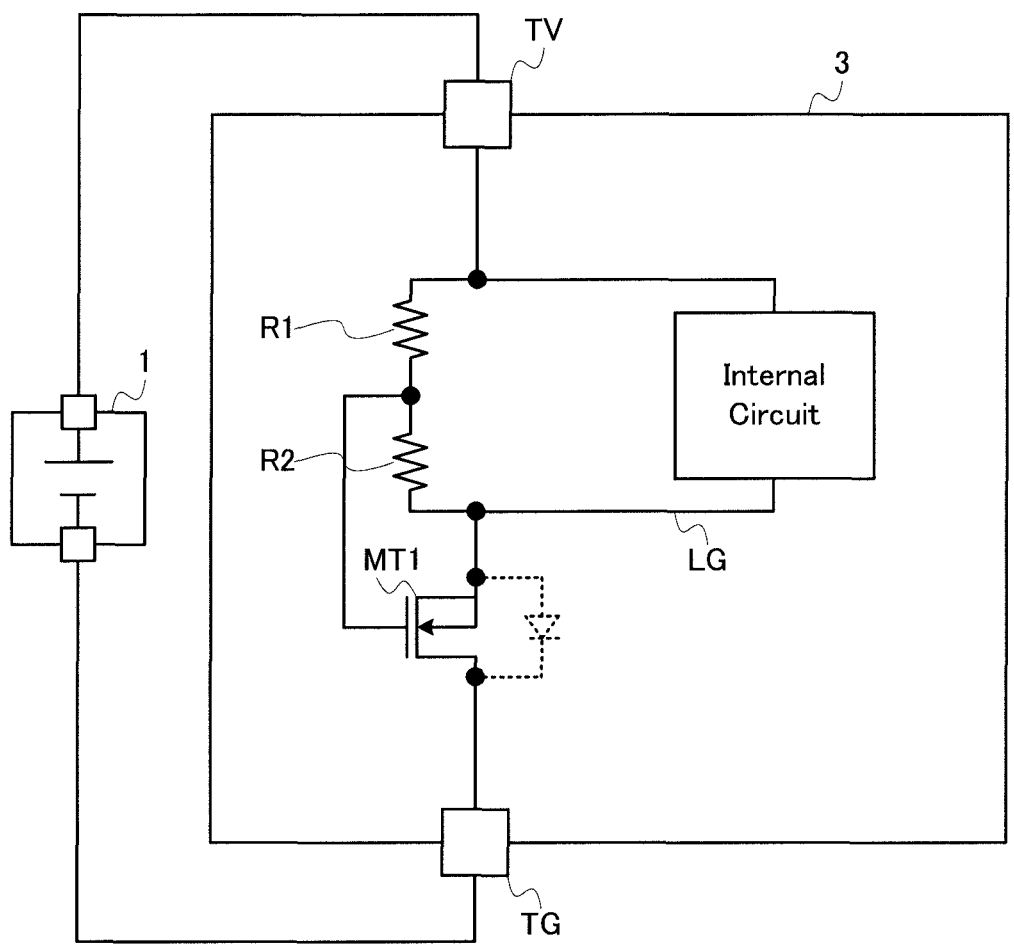
FIG. 5 is a circuit diagram illustrating a related-art electronic device.

Note that, as illustrated in FIG. 4, PMOS transistors may be used instead of the NMOS transistors. In this case, a PMOS transistor 24 has a gate connected to the ground terminal (first power supply terminal) 12, a source and a back gate that are connected to the internal power supply node 16 (internal second power supply node), and a drain connected to the power supply terminal (second power supply terminal) 11. A PMOS transistor 25 has a gate connected to the power supply terminal 11, a source and a back gate that are connected to the internal power supply node 16, and a drain connected to the ground terminal 12. The internal circuit 13 has the power supply terminal connected to the internal power supply node 16, and the internal circuit 13 has the ground terminal connected to the internal ground node (internal first power supply node) 17 that is connected to the ground terminal 12. In other words, the internal circuit 13 uses a voltage between the internal power supply node 16 and the ground terminal 12 as an operating power supply. In this case, the power supply terminal 11 is connected to the internal power supply node 16 via the PMOS transistor 24, and the ground terminal 12 is connected to the internal ground node 17.

LIST FOR REFERENCE SIGNS 10 semiconductor device
11 power supply terminal
12 ground terminal
13 internal circuit
14, 15 NMOS transistor
16 internal power supply node
17 internal ground node
20 power supply
21 power supply terminal
22 ground terminal

The invention claimed is:
1. A semiconductor device comprising:
a first MOS transistor of a first conductivity type, the first MOS transistor having a gate connected to a first power supply terminal configured for connection to a power supply, a source and a back gate connected to an internal second power supply node, and a drain connected to a second power supply terminal configured for connection to the power supply;
a second MOS transistor of the first conductivity type, the second MOS transistor having a gate connected to the second power supply terminal, a source and a back gate connected to the internal second power supply node, and a drain connected to the first power supply terminal; and
an internal circuit configured to operate with a voltage between the first power supply terminal and the internal second power supply node;
wherein the first MOS transistor of the first conductivity type, the second MOS transistor of the first conductivity type, and the internal circuit are formed in the same semiconductor substrate,
wherein the semiconductor substrate is bonded on a die pad through intermediation of an insulating adhesive material in an electrically insulated state, and is encapsulated by a resin package;
wherein the first power supply terminal comprises a power supply terminal,
wherein the second power supply terminal comprises a ground terminal,
wherein the internal second power supply node comprises an internal ground node,
wherein the first MOS transistor of the first conductivity type and the second MOS transistor of the first conductivity type comprise NMOS transistors, and
wherein during a normal connection state in which the power supply is normally connected to the semiconductor device, current flows through the internal circuit and the second MOS transistor.

2. A semiconductor device according to claim 1, wherein the first MOS transistor of the first conductivity type comprises a gate insulating film having a breakdown voltage that is equal to or higher than a voltage supplied from the power supply.

3. A semiconductor device according to claim 1, wherein the second MOS transistor of the first conductivity type comprises a gate insulating film having a breakdown voltage that is equal to or higher than a voltage supplied from the power supply.

4. A semiconductor device according to claim 1, wherein the first MOS transistor of the first conductivity type is set so that, when an ESD surge is applied to the drain thereof, a start voltage for a breakdown operation of a parasitic diode is equal to or higher than a voltage supplied from the power supply and the parasitic diode causes an ESD current surge to flow at a breakdown voltage of a gate insulating film of the second MOS transistor of the first conductivity type or lower.

5. A semiconductor device according to claim 1, wherein the second MOS transistor of the first conductivity type is set so that, when an ESD surge is applied to the drain thereof, a start voltage for a breakdown operation of a parasitic diode is equal to or higher than a voltage supplied from the power supply and the parasitic diode causes an ESD current surge to flow at a breakdown voltage of a gate insulating film of the first MOS transistor of the first conductivity type or lower.

6. A semiconductor device comprising:
a first MOS transistor of a first conductivity type, the first MOS transistor having a gate connected to a first power supply terminal configured for connection to a power supply, a source and a back gate connected to an internal second power supply node, and a drain connected to a second power supply terminal configured for connection to the power supply;
a second MOS transistor of the first conductivity type, the second MOS transistor having a gate connected to the second power supply terminal, a source and a back gate connected to the internal second power supply node, and a drain connected to the first power supply terminal; and
an internal circuit configured to operate with a voltage between the first power supply terminal and the internal second power supply node;
wherein the first MOS transistor of the first conductivity type, the second MOS transistor of the first conductivity type, and the internal circuit are formed in the same semiconductor substrate,
wherein the semiconductor substrate is bonded on a die pad through intermediation of an insulating adhesive material in an electrically insulated state, and is encapsulated by a resin package;
wherein the first power supply terminal comprises a ground terminal,
wherein the second power supply terminal comprises a power supply terminal,
wherein the internal second power supply node comprises an internal power supply node,
wherein the first MOS transistor of the first conductivity type and the second MOS transistor of the first conductivity type comprise PMOS transistors, and
wherein during a normal connection state in which the power supply is normally connected to the semiconductor device, current flows through the internal circuit and the first MOS transistor.

7. A semiconductor device according to any one of claim 6, wherein the first MOS transistor of the first conductivity type comprises a gate insulating film having a breakdown voltage that is equal to or higher than a voltage supplied from the power supply.

8. A semiconductor device according to claim 6, wherein the second MOS transistor of the first conductivity type comprises a gate insulating film having a breakdown voltage that is equal to or higher than a voltage supplied from the power supply.

9. A semiconductor device according to claim 6, wherein the first MOS transistor of the first conductivity type is set so that, when an ESD surge is applied to the drain thereof, a start voltage for a breakdown operation of a parasitic diode is equal to or higher than a voltage supplied from the power supply and the parasitic diode causes an ESD current surge to flow at a breakdown voltage of a gate insulating film of the second MOS transistor of the first conductivity type or lower.

10. A semiconductor device according to claim 6, wherein the second MOS transistor of the first conductivity type is set so that, when an ESD surge is applied to the drain thereof, a start voltage for a breakdown operation of a parasitic diode is equal to or higher than a voltage supplied from the power supply and the parasitic diode causes an ESD current surge to flow at a breakdown voltage of a gate insulating film of the first MOS transistor of the first conductivity type or lower.

* * * * *